United States Patent [19]

Kirby

[11] Patent Number: 4,965,883
[45] Date of Patent: Oct. 23, 1990

[54] METHOD AND APPARATUS FOR TRANSMITTING AND RECEIVING CHARACTERS USING A BALANCED WEIGHT ERROR CORRECTING CODE

[75] Inventor: Alan Kirby, Hollis, N.H.

[73] Assignee: Digital Equipment Corporation, Maynard, Mass.

[21] Appl. No.: 235,870

[22] Filed: Aug. 24, 1988

[51] Int. Cl.$^5$ .............................................. G06F 11/10
[52] U.S. Cl. ..................................... 371/52; 371/37.1
[58] Field of Search .................... 371/52, 57, 37, 37.1, 371/57.1

[56] References Cited

U.S. PATENT DOCUMENTS

| | | |
|---|---|---|
| 3,568,149 | 3/1971 | Sibley ..................................... 371/52 |
| 3,825,892 | 7/1974 | Catchpole ............................. 371/57 |
| 3,840,854 | 10/1974 | Franaszek ............................. 371/57 |
| 4,134,103 | 1/1979 | Huxtable ............................... 371/52 |
| 4,802,173 | 1/1989 | Baggen .................................. 371/40 |

OTHER PUBLICATIONS

Clark, Jr. and Cain, Error—Correction Coding for Digital Communications, Plenum Press, N.Y., 1981, pp. 2–7.
N. Salwen and H. Salwen, "The Design of a High Speed Token Ring Network," Technology Local Area Networks, 1984, pp. 89–96.
A. X. Widmer and P. A. Franaszek, "A DC-Balanced, Partitioned-Block, 8B/10B Transmission Code," IBM Corporation, 1983, pp. 440–451.
Knuth, "Efficient Balanced Codes," IEEE Transactions on Information Theory, vol. IT-32, Jan. 1986.
Hsiao, "A Class of Optimal Minimum Odd-Weight--Column SEC-DED Codes," J. Res. Develop., Jul. 1970, pp. 395–401.

Primary Examiner—Charles E. Atkinson
Attorney, Agent, or Firm—Finnegan, Henderson, Farabow, Garrett, and Dunner

[57] ABSTRACT

A method and apparatus for transmitting data blocks, each data block representing one of a plurality of characters, between a transmitting station and a receiving station of a distributed processing system. The characters are encoded in the transmitting station according to a code set so that each transmitted data block has an equal number binary ones and zeroes and a distance of at least four. The code is self-clocking and allows one bit error correction and AC coupling.

42 Claims, 8 Drawing Sheets

TRANSMITTING STATION

ENCODER i OF THE DECODER IN THE RECEIVING STATION

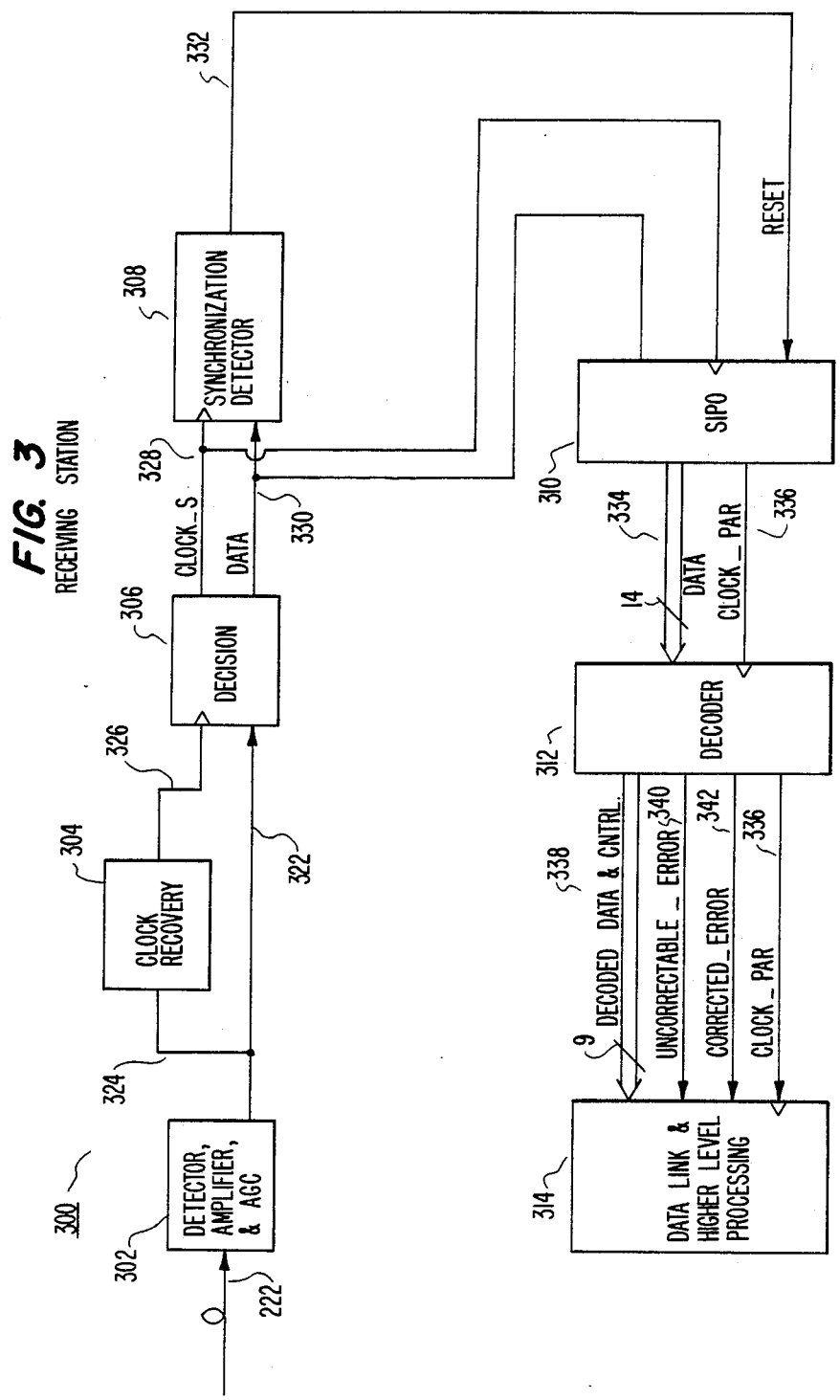

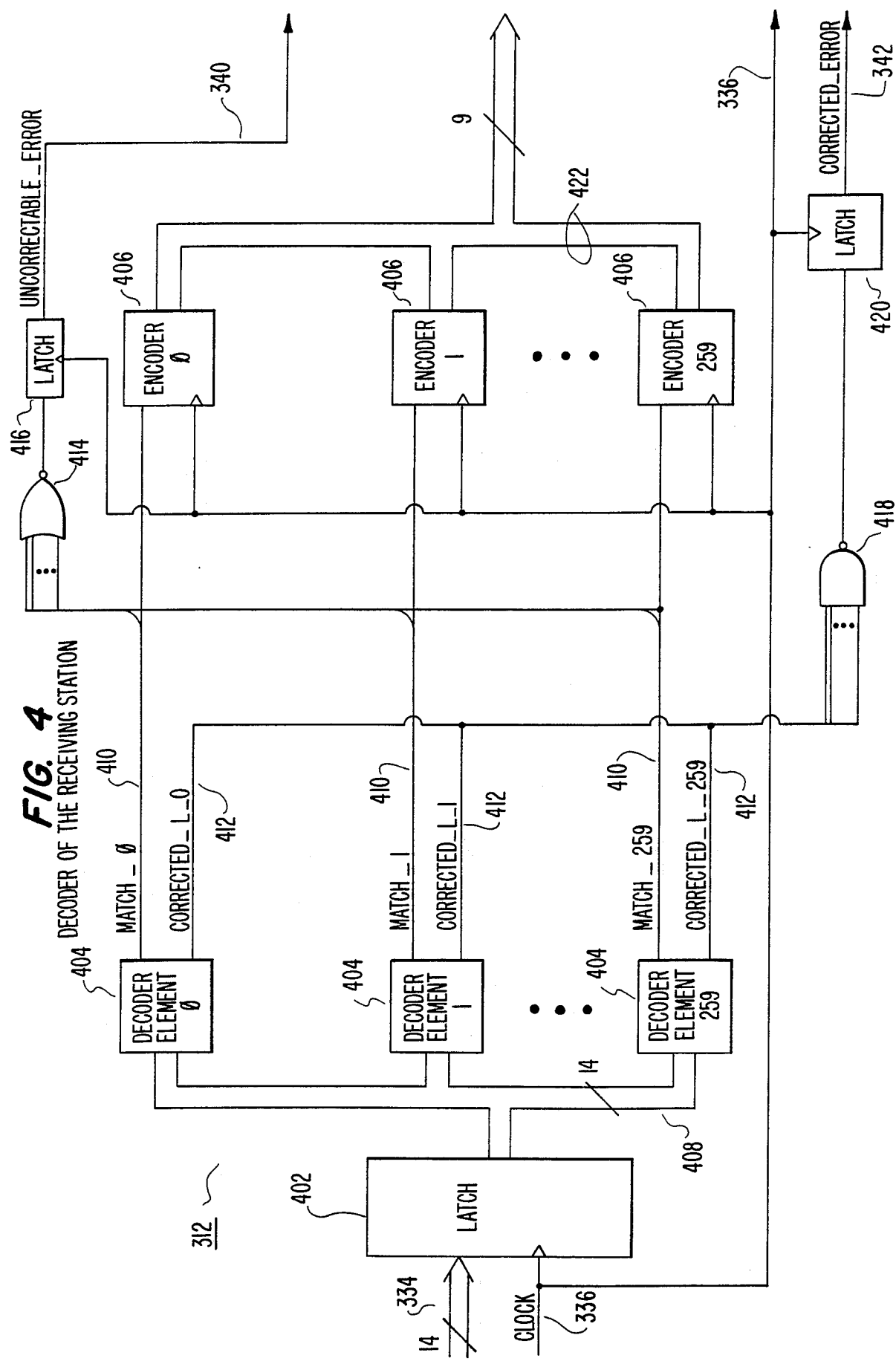

DECODER i OF THE DECODER IN THE RECEIVING STATION

DECODER i OF THE DECODER IN THE RECEIVING STATION

FIG. 7A

CODE A

| | | | | | | | |
|---|---|---|---|---|---|---|---|
| R: | 0 | 3d06 | R: | 1 | 3d21 | R: 2 | 3e11 |
| I: | 0 | 1595 | | | | | |
| U: | 1 | 7ffc002 | U: | 0 | ff8004 | | |
| C: | 0 | 1de | C: | 1 | 27d | C: 2 | 2ee | C: 3 |
| C: | 8 | 4bb | C: | 9 | 51f | C: a | 5d3 | C: b |
| C: | 10 | 778 | C: | 11 | 78b | C: 12 | 7b4 | C: 13 |
| C: | 18 | a1f | C: | 19 | af1 | C: 1a | b27 | C: 1b |
| C: | 20 | ce9 | C: | 21 | d2e | C: 22 | d87 | C: 23 |
| C: | 28 | f29 | C: | 29 | 107b | C: 2a | 109f | C: 2b |
| C: | 30 | 11cb | C: | 31 | 1237 | C: 32 | 124f | C: 33 |
| C: | 38 | 1387 | C: | 39 | 13cc | C: 3a | 13f0 | C: 3b |
| C: | 40 | 1536 | C: | 41 | 1559 | C: 42 | 1565 | C: 43 |
| C: | 48 | 163a | C: | 49 | 1655 | C: 4a | 1666 | C: 4b |
| C: | 50 | 170d | C: | 51 | 1731 | C: 52 | 1752 | C: 53 |
| C: | 58 | 18ce | C: | 59 | 18f2 | C: 5a | 1935 | C: 5b |
| C: | 60 | 19aa | C: | 61 | 19c5 | C: 62 | 1a39 | C: 63 |
| C: | 68 | 1aa6 | C: | 69 | 1ac9 | C: 6a | 1b0e | C: 6b |
| C: | 70 | 1c33 | C: | 71 | 1c6c | C: 72 | 1c9c | C: 73 |
| C: | 78 | 1e34 | C: | 79 | 1e58 | C: 7a | 1ea8 | C: 7b |
| C: | 80 | 20cf | C: | 81 | 20f3 | C: 82 | 215b | C: 83 |
| C: | 88 | 226b | C: | 89 | 229b | C: 8a | 22a7 | C: 8b |
| C: | 90 | 23e8 | C: | 91 | 245d | C: 92 | 246e | C: 93 |
| C: | 98 | 2556 | C: | 99 | 2569 | C: 9a | 2599 | C: 9b |
| C: | a0 | 265a | C: | a1 | 2665 | C: a2 | 2695 | C: a3 |
| C: | a8 | 2762 | C: | a9 | 2792 | C: aa | 27a1 | C: ab |
| C: | b0 | 2936 | C: | b1 | 2939 | C: b2 | 2955 | C: b3 |
| C: | b8 | 2a35 | C: | b9 | 2a3a | C: ba | 2a59 | C: bb |
| C: | c0 | 2b2c | C: | c1 | 2b52 | C: c2 | 2b61 | C: c3 |
| C: | c8 | 2c71 | C: | c9 | 2cb2 | C: ca | 2ccc | C: cb |
| C: | d0 | 2da8 | C: | d1 | 2e0e | C: d2 | 2e54 | C: d3 |
| C: | d8 | 2fc0 | C: | d9 | 3075 | C: da | 30b6 | C: db |
| C: | e0 | 31ac | C: | e1 | 31d1 | C: e2 | 321e | C: e3 |
| C: | e8 | 3389 | C: | e9 | 341b | C: ea | 3427 | C: eb |
| C: | f0 | 36d0 | C: | f1 | 370a | C: f2 | 3784 | C: f3 |
| C: | f8 | 3a23 | C: | f9 | 3a8c | C: fa | 3ab0 | C: fb |

FIG. 7B

CODE A

| | | | | | | | | |
|---|---|---|---|---|---|---|---|---|
| 376 | C: | 4 | 3ba | C: | 5 | 3d9 | C: | 6 | 3e5 | C: | 7 | 47 |
| 5ec | C: | c | 62f | C: | d | 6dc | C: | e | 6e3 | C: | f | 74 |
| 8b7 | C: | 14 | 8db | C: | 15 | 94f | C: | 16 | 973 | C: | 17 | 9f |
| b5c | C: | 1c | b8d | C: | 1d | c7a | C: | 1e | cd5 | C: | 1f | ce |
| db1 | C: | 24 | e4b | C: | 25 | ed2 | C: | 26 | f15 | C: | 27 | f1 |
| 10e7 | C: | 2c | 10fc | C: | 2d | 112f | C: | 2e | 1157 | C: | 2f | 11b |
| 12ab | C: | 34 | 12d3 | C: | 35 | 131b | C: | 36 | 133c | C: | 37 | 136 |
| 143d | C: | 3c | 145e | C: | 3d | 14ae | C: | 3e | 14cd | C: | 3f | 14f |
| 156a | C: | 44 | 1bd | C: | 45 | 159a | C: | 46 | 15a9 | C: | 47 | 15c |
| 1669 | C: | 4c | 1696 | C: | 4d | 1699 | C: | 4e | 16a5 | C: | 4f | 16c |
| 17a2 | C: | 54 | 17c1 | C: | 55 | 183e | C: | 56 | 185d | C: | 57 | 18a |
| 195a | C: | 5c | 1966 | C: | 5d | 1969 | C: | 5e | 1996 | C: | 5f | 199 |
| 1a56 | C: | 64 | 1a65 | C: | 65 | 1a6a | C: | 66 | 1a95 | C: | 67 | 1a9 |
| 1b32 | C: | 6c | 1b51 | C: | 6d | 1ba1 | C: | 6e | 1bc2 | C: | 6f | 1c0 |
| 1cc3 | C: | 74 | 1d38 | C: | 75 | 1d54 | C: | 76 | 1da4 | C: | 77 | 1dc |
| 1ec4 | C: | 7c | 1f03 | C: | 7d | 1f60 | C: | 7e | 1f90 | C: | 7f | 203 |
| 2167 | C: | 84 | 217c | C: | 85 | 2197 | C: | 86 | 21ab | C: | 87 | 225 |
| 22bc | C: | 8c | 230f | C: | 8d | 2333 | C: | 8e | 23c3 | C: | 8f | 23d |
| 249e | C: | 94 | 24ad | C: | 95 | 24f4 | C: | 96 | 2535 | C: | 97 | 253 |
| 25a6 | C: | 9c | 25c5 | C: | 9d | 25ca | C: | 9e | 2636 | C: | 9f | 263 |
| 26aa | C: | a4 | 26c6 | C: | a5 | 26c9 | C: | a6 | 271c | C: | a7 | 275 |
| 285e | C: | ac | 286d | C: | ad | 289d | C: | ae | 28ae | C: | af | 28f |
| 296a | C: | b4 | 299a | C: | b5 | 29a5 | C: | b6 | 29c6 | C: | b7 | 29c |
| 2a66 | C: | bc | 2a96 | C: | bd | 2aa9 | C: | be | 2ac5 | C: | bf | 2ac |
| 2b91 | C: | c4 | 2ba2 | C: | c5 | 2c17 | C: | c6 | 2c2b | C: | c7 | 2c3 |
| 2d0d | C: | cc | 2d43 | C: | cd | 2d58 | C: | ce | 2d64 | C: | cf | 2d9 |
| 2e68 | C: | d4 | 2e83 | C: | d5 | 2e98 | C: | d6 | 2ea4 | C: | d7 | 2f3 |
| 30b9 | C: | dc | 30da | C: | dd | 311d | C: | de | 314e | C: | df | 317 |
| 322d | C: | e4 | 3278 | C: | e5 | 32e1 | C: | e6 | 3326 | C: | e7 | 334 |
| 34e2 | C: | ec | 3583 | C: | ed | 35b0 | C: | ee | 3643 | C: | ef | 364 |
| 3847 | C: | f4 | 388b | C: | f5 | 38d4 | C: | f6 | 3913 | C: | f7 | 39e |
| 3b14 | C: | fc | 3b48 | C: | fd | 3c49 | C: | fe | 3c52 | C: | ff | 3c8 |

CODE B

| | | | | | | | |
|---|---|---|---|---|---|---|---|
| I: | 0 | 1535 | | | | | |
| U: | 1 | 7ffc002 | U: | 0 | fff8004 | | |
| C: | 0 | 1be | C: | 1 | 27e | C: | 2 | 2bd | C: | 3 |
| C: | 8 | 4b7 | C: | 9 | 4db | C: | a | 51f | C: | b |
| C: | 10 | 727 | C: | 11 | 74b | C: | 12 | 774 | C: | 13 |
| C: | 18 | 9a7 | C: | 19 | 9d3 | C: | 1a | 9ec | C: | 1b |
| C: | 20 | b78 | C: | 21 | b8d | C: | 22 | bb4 | C: | 23 |
| C: | 28 | db1 | C: | 29 | e2e | C: | 2a | e4d | C: | 2b |
| C: | 30 | 103f | C: | 31 | 10cf | C: | 32 | 10f3 | C: | 33 |
| C: | 38 | 1257 | C: | 39 | 126b | C: | 3a | 129b | C: | 3b |
| C: | 40 | 13c3 | C: | 41 | 145d | C: | 42 | 147a | C: | 43 |
| C: | 48 | 1599 | C: | 49 | 15c5 | C: | 4a | 15ca | C: | 4b |
| C: | 50 | 16c9 | C: | 51 | 16d2 | C: | 52 | 1751 | C: | 53 |
| C: | 58 | 18e9 | C: | 59 | 1936 | C: | 5a | 1939 | C: | 5b |
| C: | 60 | 1a3a | C: | 61 | 1a59 | C: | 62 | 1a66 | C: | 63 |
| C: | 68 | 1c3c | C: | 69 | 1c63 | C: | 6a | 1c93 | C: | 6b |
| C: | 70 | 1da8 | C: | 71 | 1e0b | C: | 72 | 1e54 | C: | 73 |
| C: | 78 | 1fc0 | C: | 79 | 207b | C: | 7a | 209f | C: | 7b |
| C: | 80 | 21cb | C: | 81 | 2237 | C: | 82 | 224f | C: | 83 |
| C: | 88 | 2387 | C: | 89 | 23cc | C: | 8a | 23f0 | C: | 8b |
| C: | 90 | 2536 | C: | 91 | 2559 | C: | 92 | 2565 | C: | 93 |
| C: | 98 | 263a | C: | 99 | 2655 | C: | 9a | 2666 | C: | 9b |
| C: | a0 | 270d | C: | a1 | 2731 | C: | a2 | 2752 | C: | a3 |
| C: | a8 | 28ce | C: | a9 | 28f2 | C: | aa | 2935 | C: | ab |
| C: | b0 | 29aa | C: | b1 | 29c5 | C: | b2 | 2a39 | C: | b3 |
| C: | b8 | 2aa6 | C: | b9 | 2ac9 | C: | ba | 2b0e | C: | bb |
| C: | c0 | 2c33 | C: | c1 | 2c6c | C: | c2 | 2c9c | C: | c3 |
| C: | c8 | 2e34 | C: | c9 | 2e58 | C: | ca | 2ea8 | C: | cb |
| C: | d0 | 3076 | C: | d1 | 30b5 | C: | d2 | 30ba | C: | d3 |
| C: | d8 | 31d2 | C: | d9 | 31e8 | C: | da | 321e | C: | db |
| C: | e0 | 332a | C: | e1 | 3349 | C: | e2 | 3354 | C: | e3 |
| C: | e8 | 352c | C: | e9 | 3543 | C: | ea | 35b0 | C: | eb |
| C: | f0 | 3827 | C: | f1 | 38e4 | C: | f2 | 3983 | C: | f3 |
| C: | f8 | 3c4a | C: | f9 | 3c70 | C: | fa | 3c86 | C: | fb |

CODE B

FIG. 8A
/—800

| | | | | | | | | | | | | |
|---|---|---|---|---|---|---|---|---|---|---|---|---|
| 3d5 | C: | 4 | 3da | C: | 5 | 3e6 | C: | 6 | 3e9 | C: | 7 | 46 |
| 573 | C: | c | 5dc | C: | d | 68f | C: | e | 6e3 | C: | f | 6e |
| 793 | C: | 14 | 7b8 | C: | 15 | 877 | C: | 16 | 8bb | C: | 17 | 94 |
| a1f | C: | 1c | ac7 | C: | 1d | adc | C: | 1e | af1 | C: | 1f | b2 |
| c79 | C: | 24 | cd5 | C: | 25 | ce6 | C: | 26 | d2d | C: | 27 | d8 |
| e53 | C: | 2c | eb2 | C: | 2d | f15 | C: | 2e | f1a | C: | 2f | f4 |
| 115b | C: | 34 | 1167 | C: | 35 | 1197 | C: | 36 | 11ab | C: | 37 | 11f |
| 12a7 | C: | 3c | 130f | C: | 3d | 1333 | C: | 3e | 136c | C: | 3f | 139 |
| 149e | C: | 44 | 14ad | C: | 45 | 17d | C: | 46 | 1556 | C: | 47 | 156 |
| 1636 | C: | 4c | 1639 | C: | 4d | 1665 | C: | 4e | 1695 | C: | 4f | 16a |
| 1762 | C: | 54 | 17a1 | C: | 55 | 185e | C: | 56 | 189d | C: | 57 | 18a |
| 1955 | C: | 5c | 196a | C: | 5d | 199a | C: | 5e | 19c6 | C: | 5f | 1a3 |
| 1a96 | C: | 64 | 1aca | C: | 65 | 1b52 | C: | 66 | 1b61 | C: | 67 | 1ba |
| 1ccc | C: | 6c | 1d07 | C: | 6d | 1d58 | C: | 6e | 1d64 | C: | 6f | 1d9 |
| 1e68 | C: | 74 | 1e98 | C: | 75 | 1ea4 | C: | 76 | 1f0c | C: | 77 | 1f3 |
| 20e7 | C: | 7c | 20fc | C: | 7d | 212f | C: | 7e | 2157 | C: | 7f | 21b |
| 22ab | C: | 84 | 22d3 | C: | 85 | 231b | C: | 86 | 233c | C: | 87 | 236 |
| 243d | C: | 8c | 245e | C: | 8d | 24ae | C: | 8e | 24cd | C: | 8f | 24f |
| 256a | C: | 94 | 2595 | C: | 95 | 259a | C: | 96 | 25a9 | C: | 97 | 25c |
| 2669 | C: | 9c | 2696 | C: | 9d | 2699 | C: | 9e | 26a5 | C: | 9f | 26c |
| 27a2 | C: | a4 | 27c1 | C: | a5 | 283e | C: | a6 | 285d | C: | a7 | 28a |
| 295a | C: | ac | 2966 | C: | ad | 2969 | C: | ae | 2996 | C: | af | 299 |
| 2a56 | C: | b4 | 2a65 | C: | b5 | 2a6a | C: | b6 | 2a95 | C: | b7 | 2a9 |
| 2b32 | C: | bc | 2b51 | C: | bd | 2ba1 | C: | be | 2bc2 | C: | bf | 2c0 |
| 2cc3 | C: | c4 | 2d38 | C: | c5 | 2d54 | C: | c6 | 2da4 | C: | c7 | 2dc |
| 2ec4 | C: | cc | 2f03 | C: | cd | 2f60 | C: | ce | 2f90 | C: | cf | 306 |
| 30d9 | C: | d4 | 311d | C: | d5 | 314e | C: | d6 | 3171 | C: | d7 | 31a |
| 3278 | C: | dc | 328d | C: | dd | 32c6 | C: | de | 32e1 | C: | df | 332 |
| 3391 | C: | e4 | 3417 | C: | e5 | 342b | C: | e6 | 34d4 | C: | e7 | 34e |
| 364c | C: | ec | 3683 | C: | ed | 3706 | C: | ee | 3718 | C: | ef | 381 |
| 398c | C: | f4 | 3a2c | C: | f5 | 3a43 | C: | f6 | 3ab0 | C: | f7 | 3c4 |
| 3c89 | C: | fc | 3d11 | C: | fd | 3d22 | C: | fe | 3e12 | C: | ff | 3e2 |

FIG. 8A

METHOD AND APPARATUS FOR TRANSMITTING AND RECEIVING CHARACTERS USING A BALANCED WEIGHT ERROR CORRECTING CODE

BACKGROUND OF THE INVENTION

The present invention relates to a method and apparatus for transmitting and receiving characters in a distributed processing system and, in particular, to a transmitting method and apparatus using a balanced weight error correcting code.

NETWORK BACKGROUND

In modern distributed processing systems, a need exists for data to be transferred between various stations or nodes of the system. Often, the data to be transferred consists of characters in a commonly recognized format, such as ASCII characters, or ASCII characters with one or more additional parity or control bits.

FIGS. 1a through 1c show examples of various ways that stations can be interconnected to form such distributed processing systems. FIG. 1a shows a portion 100 of a distributed processing system having a first station 102 and a second station 104. First station 102 is connected to second station 104 by a simplex channel 106. Data characters are transmitted by first station 102 to second station 104. Thus, first station 102 is called a transmitting station and second station station 104 is called a receiving station.

Similarly, FIG. 1b shows a portion 110 of a distributed processing system having a first station 102' and a second station 104'. First station 102' and second station 104' are connected by a duplex channel 116. The station sending data is the transmitting station, regardless of the channel type.

FIG. 1c shows a distributed processing system 120 having a first station 122 and a second station 124 connected by a switching network 126. First station 122 and second station 124 are connected to switching network 126 by two duplex channels 132. Switching network 126 includes three switching stations 128 interconnected by three duplex channels 130. Thus, if first station 122 is a transmitting station and second station 124 is a receiving station, characters may pass from first station 122 through switching network 126 to second station 124 by way of one of two possible non-cyclic paths depending upon the settings of the switching stations 128. FIG. 1c shows only one example of switching network 126. Many other arrangements of switching stations 128 are possible in switching network 126.

First stations 102, 102', and 122 and second stations 104, 104', and 124 may be any number of devices of a type, such as mainframe computers, microprocessors, bridges, gateways, workstations, servers, storage devices, or the like that are normally connected together in a distributed processing system. Switching stations 128 may be computers, dedicated switches, or the like. It should be noted that any of the distributed processing systems of FIGS. 1a-1c could contain additional elements similar to those described.

Communication of information between stations or nodes in a distributed processing system often follows the ISO reference model or similar models. Stations conforming to the ISO reference model transmit and receive data in groups called frames. Each frame includes a packet of characters, which can be referred to as data blocks. A single message to be transmitted may need to be broken into multiple packets, each of which contains a sequence number identifying the order of the packet within the message. Upon receipt of each message, a receiving station operating according to the ISO model normally sends an acknowledgment message to the transmitting station. Alternately, a single message may be transmitted in un-numbered packets called datagrams. Datagrams are not acknowledged by the intermediate switching stations.

The ISO reference model has seven layers, each of which performs a function in a transmission of data between interconnecting stations. The lowest four layers of the ISO model are:
(1) The physical layer,
(2) The data link layer,
(3) The network layer, and
(4) The transport layer.

The physical layer is the lowest layer. It handles the physical operations necessary to transmit characters over interconnecting channels, such as simplex channel 106, duplex channel 116, or duplex channels 130 and 132. The data link layer handles the delimitation of frames and the alignment of bits within the frames. The network layer supplies the mechanisms by which frames are forwarded to their correct destinations, i.e., the routing algorithms used for that particular distributed processing system. The transport layer supplies the mechanisms that guarantee exactly one, in sequence delivery of complete single or multi-packet messages to the higher layers of the ISO model.

Existing distributed systems operating according to the ISO reference model generally detect transmission errors through the use of a cyclic redundancy code (CRC) or parity bits. Both the data link layer and the transport layer are responsible for detecting different types of errors in the transmitted data and for requesting a retransmission of the packet containing the error. The data link layer only requests a retransmission of a packet if a subsequent packet arrives with a higher sequence number than the packet at issue. If, for example, a distributed processing system is transmitting data in datagrams, which do not contain data link sequence numbers, the data link layer will never have sufficient information to request a retransmission. Even when data is transmitted in packets with sequence numbers, a packet subsequent to the erroneous packet may take a relatively long period of time to arrive at the receiving station and, therefore, the delay for a request for retransmission from the data link layer may be considerable.

The transport layer usually detects an error when the transport layer implementation in a transmitting station detects the passage of a selected time interval without reception of an acknowledgment from the receiving station. This fixed time interval is usually quite long (on the order of seconds), even in systems having high data transmission rates, because the interval must be long enough to account for the slowest data transmission rate in the system. Setting a too short request-for-retransmission interval results in unnecessary retransmissions in the system. Thus, the delay for a request for retransmission from the ISO transport layer can also be considerable.

Transmission Codes

A group of symbols for encoding data is called a code set and the specific symbols in the code set are called code words. A code set is systematic if each code word in the code set includes the bits of the character it encodes. For example, in a systematic code set, the code word encoding the ASCII character "A" would contain the data bits "01000001"therein (although not necessarily contiguously). Code words in a non-systematic code set do not necessarily contain the character which they encode. Code words are transmitted as data blocks over channels. Due to transmission errors, a data block received by a receiving station may not match the data block that was transmitted.

(1) Error detection and balanced weight codes

In a balanced weight code set, all code words contain an equal number of ones and zeros. Balanced weight coding allows the design of simplified receiving hardware in a receiving station. A digital sum variation (DSV) is defined as a variation in a running sum of the bits of the received data blocks. Assume, for example, that a "1"bit is assigned a value of $+1$ and a "0"bit is assigned a value of $-1$. A sum of the bits of each received block in a system using a balanced weight code equals zero because the numbers of ones and zeroes are equal. Thus, in a system using eight bit balanced weight code words, the largest value the running sum could attain is four, which would occur when a data block begins with a string of all ones, e.g., "11110000." Since the DSV is zero at the end of each data block, the code set is free of any DC component and the receiving station may be AC coupled without penalty. The ability to be AC coupled is desirable in distributed processing systems using high data rate fiber optic components.

Similarly, balanced weight code sets can be self-clocking because they contain a sufficient number of zero-to-one and one-to-zero transitions to permit recovery of a clock signal.

A receiving station in a distributed processing system transmitting data using a balanced weight code set detects an error whenever received data blocks do not have an equal number of ones and zeroes. When such an error is detected, the receiving station may issue a request for retransmission, or may take some other action to deal with the erroneous data block.

For example, an error in a channel connecting a transmission station and a receiving station may cause a received data block to contain all ones. Similarly, in a system using eight bit data blocks, a received data block may contain three ones and five zeroes. Both errors can be detected by a receiving station expecting a balanced number of zeroes and ones. Note, however, that while a receiving station can detect the received data blocks as erroneous, it can not correct the errors. When such errors are detected, further action, such as a request for resend, must occur to correct the erroneous data blocks.

Unfortunately, balanced weight coding schemes do not detect all types of transmission errors. For example, if a transmitted data block contains the balanced code "00001111," but the receiving station receives the block as "00010111," i.e., with the fourth and fifth bits complemented, the receiving station will not detect the error because the number of ones and zeroes in the block are still equal. Thus, balanced weight coding schemes will not detect even numbers of errors.

In one balanced weight coding scheme, called Manchester encoding, each bit of data to be transmitted is encoded in two bits—the original bit and its complement. Thus, for example, a group of data "110"is encoded as "101001"with Manchester encoding. Each "1"is encoded as "10"and each "0"is encoded as "01."

While the original data (110) has an uneven number of zeroes and ones, the number of zeroes and ones in the transmitted data (101001) is equal.

Manchester encoding provides a simple method of ensuring that transmitted data is balanced. However, it also entails transmitting twice the number of data bits. Distributed processing systems requiring speed cannot afford the reduced transmission rate entailed by Manchester encoding and, thus, must use other types of balanced weight coding.

(2) Error detection/correction and fixed-distance codes

While balanced weight coding schemes, CRC checks, and parity checks can detect the presence of transmission errors in a distributed processing system, they do not directly provide a means for correcting the detected errors. A distributed processing system using a fixed-distance code set, on the other hand, can detect and correct errors in blocks of transmitted data. In fixed-distance codes, a given code word differs from all other code words in at least a fixed number of bit positions. This fixed number is called a distance. With fixed-distance codes having a distance of at least three, single bit errors in received data can be detected and corrected.

For example, suppose that the data characters "A" and "B" are encoded as the following code words:

| 12345678 bit position |
|---|
| A: 11111100 |
| B: 11110011 |

The code words encoding data characters "A" and "B" differ from each other at bit positions 5, 6, 7, and 8. If all other code words in the above code set differ from each other by at least four bits, then the code has a distance of four and single bit errors can be corrected. If, to continue with the above example, a data block of "11111100"is received by a receiving station, the receiving station can identify the received data block as an encoded "A" because the bits in the received block match the bits in the code word encoding the "A" character.

Occasionally, however, an error may occur in the transmission of an encoded character. The receiving station may, for example, receive a data block of "11111000." This received data block does not match any code word in the code set. It differs from an encoded "A" block in only one bit position (bit position 6) and, because all other code words differ from "11111100" (the encoded "A" character) by at least four bit positions, the received data block does not match any other code words in the code set. Therefore, the receiving station deems the received data block to be an encoded "A" with an error in bit position 6. Thus, a received data block containing a single bit error can be corrected by a code set having a distance of four.

The code set in the above example can detect, but not correct, two-bit errors. It can also detect, but not correct, some but not all three-bit errors. For example, suppose that the characters are again encoded as described above. A received data block of "11111010"differs from the encoded data character "A" at bit positions 6 and 7. The received data block differs from the encoded "B" character at bit positions 5 and 8. The error is detectable, since the received data block does not match any code word in the code set. However, the error is not correctable, since there is no way to determine whether the received data block was transmitted as an encoded "A" or "B." Balanced weight code sets of distance four can not detect all bit errors of a number of bits greater than or equal to their distance. Code sets having a greater distance allow the correction of a greater number of bit errors but slow the data transmission rate of the system, since the code words of such codes are of increased length.

In summary, various types of encoding methods exist for transmission of data in distributed processing systems. CRC checks, parity checks, and balanced weight code sets allow for the detection of some types of errors, but cannot correct errors. The only way to obtain corrected data in such systems is to request a retransmission of the data. In addition, balanced weight code sets allow a receiving station to be AC coupled and often provide a strong clock component. Fixed-distance code sets allow correction of a fixed number of bit position errors. However, not all fixed-distance codes provide a reliable clock component since the existence of a clock component depends on the transitions found in the specific code set. Nor do fixed-distance codes allow the use of simpler AC coupled hardware. To summarize, there are code sets which are balanced but do not correct errors and there are code sets which correct errors but are not balanced.

The present invention overcomes the problems and disadvantages of the prior art by transmitting and receiving data according to a balanced weight, fixed-distance code set.

SUMMARY OF THE INVENTION

Additional advantages of the invention will be set forth in part in the description which follows, and in part will be obvious from the description, or may be learned by practice of the invention. The advantages of the invention will be realized and attained by means of the elements and combinations particularly pointed out in the appended claims.

To achieve the foregoing advantages, and in accordance with the purposes of the invention as embodied and broadly described herein, a distributed processing system for transmitting data blocks from a transmitting station to a receiving station is provided, each data block representing one of a plurality of code words encoding one of a plurality of characters, the distributed processing system comprising: encoding means in the transmitting station for converting each of the plurality of characters to a predetermined corresponding one of a plurality of balanced weight fixed-distance code words; transmitting means for transmitting the code words as data blocks; receiving means for receiving the transmitted data blocks; and decoding means in the receiving station for converting each of the received data blocks to the ones of the characters corresponding to the code words represented by the received data blocks.

In further accordance with the purpose of the invention, as embodied and broadly described herein, the invention comprises: a method, performed by a data processing system having a memory, for identifying a plurality of balanced weight fixed-distance code words for encoding a plurality of characters, the method comprising the steps of: listing in the memory of the data processor a plurality of fixed length blocks of data bits having an equal number of binary ones and zeroes; identifying, in the memory of the data processing system, those of the blocks having a distance of four from each other; halting the step of identifying when the number of identified blocks equals the number of characters; and assigning each of said characters to a different one of said identified blocks.

BRIEF DESCRIPTION OF THE DRAWINGS

The accompanying drawings, which are incorporated in and constitute a part of this specification, illustrate several embodiments of the invention and, together with the description, serve to explain the principles of the invention.

FIG. 3 is a block diagram of a preferred embodiment of a receiving station in a distributed processing system according to the present invention.

FIG. 4 is a block diagram of a decoder of the receiving station of FIG. 3.

FIG. 7 is a listing of a first code set according to a preferred embodiment of the present invention.

FIG. 8 is a listing of a second code set according to a preferred embodiment of the present invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

Figure 1A:
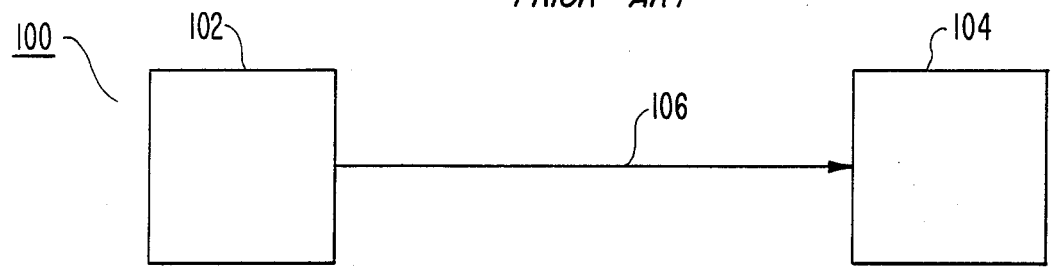
FIG. 1a is a block diagram of a portion of a distributed processing system having a first station and a second station connected by a simplex channel.
Figure 1B:
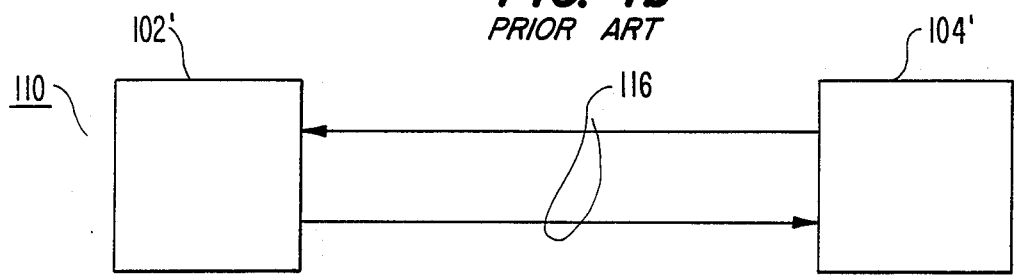
FIG. 1b is a block diagram of a portion of a distributed processing system having a first station and a second station connected by a duplex channel.
Figure 1C:
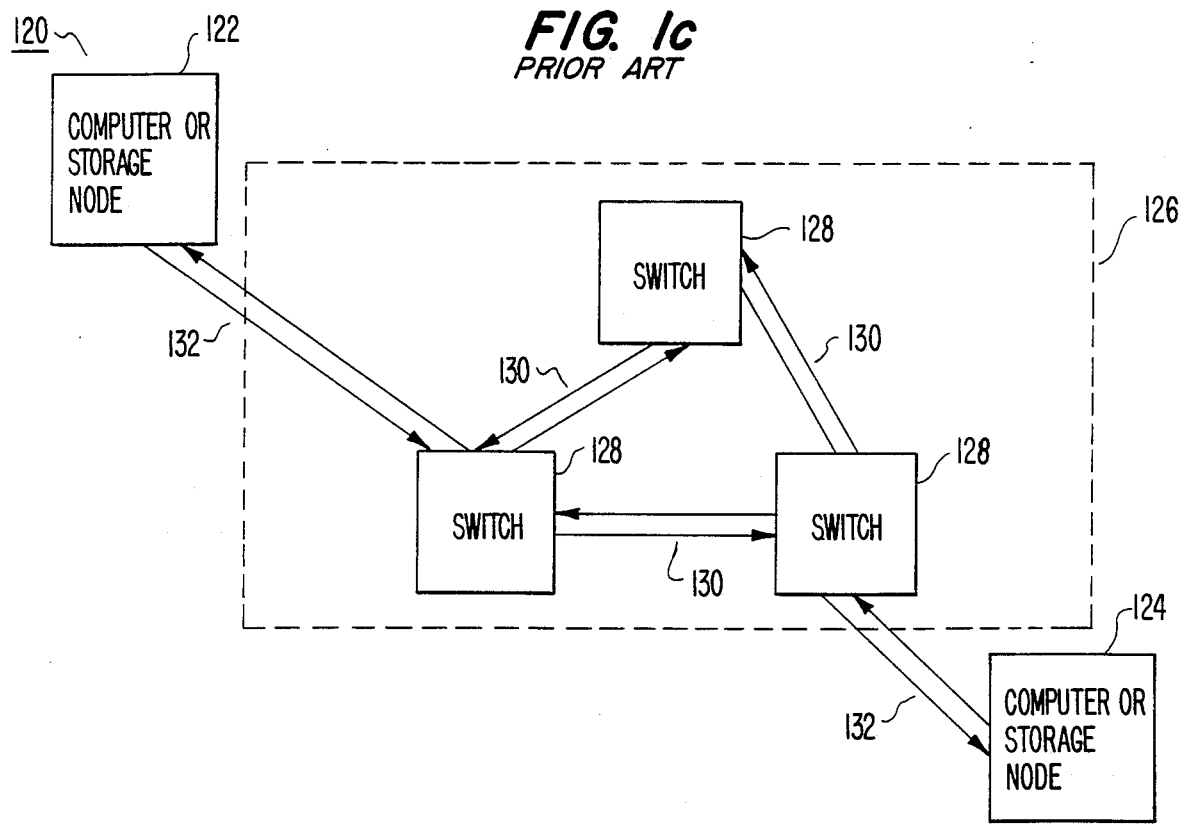
FIG. 1c is a block diagram of a portion of a distributed processing system having a first station and a second station connected by a switching network.
Figure 2:
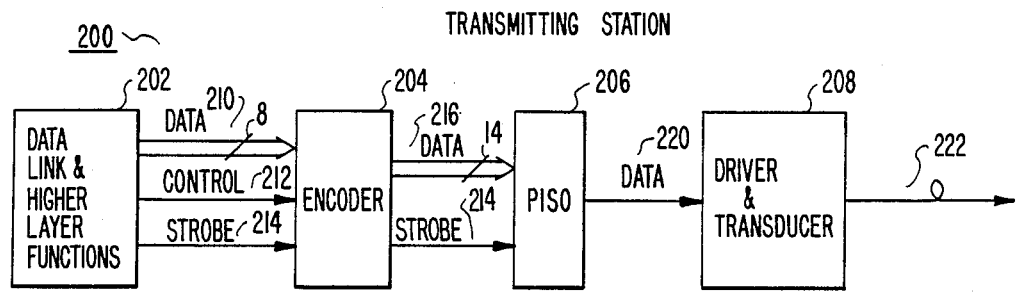
FIG. 2 is a block diagram of a preferred embodiment of a transmitting station in a distributed processing system according to the present invention.

FIG. 2 shows a transmitting station 200 having a data link element 202, a 8-bit data bus 210, a control line 212, a strobe line 214, an encoder 204, a 14-bit data bus 216, a parallel to serial converter (PISO) 206, a serial data line 220, a driver and transducer 208, and an external communications channel 222.

Data link element 202 is connected to encoder 204 by 8-bit data bus 210, control line 212, and strobe line 214. Encoder 204 is connected to PISO 206 by 14-bit data bus 216 and strobe line 214. PISO 206 is connected to driver and transducer 208 by serial data line 220. Driver and transducer 208 is connected to other stations (not shown) in the distributing processing system by channel 222.

In accordance with the invention, the invention comprises encoding mean in the transmitting station for converting each of a plurality of characters to a predetermined corresponding one of a plurality of balanced weight fixed-distance code words. Each code word has an equal number of binary ones and zeroes and a distance of at least four.

Encoder 204 of FIG. 2, shown by way of example and not as a limitation, accepts 8-bit characters and a strobe signal on 8-bit data bus 210 and strobe line 214, respectively, from data link and higher layer functions block 202 and outputs a 14-bit code word on 14-bit data bus 216 and a strobe on strobe line 214 to PISO 206. Encoder 204 also receives a control signal on control line 212. The control signal indicates whether the 8-bit data is to be considered a control character for encoding purposes. In a preferred embodiment, encoder 204 includes a 512×14 bit ROM containing a code set described below. This ROM is preferably incorporated into an area on an IC die that also implements other functions such as data link layer functions.

PISO 206 outputs the code word as serial data on serial line 220 to driver and transducer 208 where the serial data is transmitted as data blocks on channel 222 to a receiving station.

In a preferred embodiment, encoder 204 encodes character data according to balanced weight fixed-distance code set A of FIG. 7, which is embodied in the above-mentioned ROM. Code set A includes a control code portion 710, a resynchronization portion 712, and a data encoding portion 714. Control code portion 710 includes four 14-bit code words corresponding to and for encoding various control characters. Resynchronization portion 712 contains two 28-bit code words corresponding to and for encoding resynchronization characters. Data encoding portion 714 includes code words 0 through FF (hexadecimal), corresponding to and for encoding 256 data characters. Thus, code set A contains a total of 260 14-bit code words (in control code portion 710 and data encoding portion 714) and two 28-bit code words (in resynchronization portion 712). The 14-bit code words are balanced and have a distance of at least four. The 28-bit code words are also balanced (over each 28-bit sequence) and are chosen so that a received sequence of several resynchronization data blocks will not duplicate any received sequence of framed or unframed valid 14-bit data blocks. Code words having different numbers of data bits and distances may also be used to practice the invention.

FIG. 8 shows a balanced weight fixed-distance code set B according to another preferred embodiment of the present invention. Code set B is also embodied in the above-mentioned ROM and includes a control code portion 810, a resynchronization portion 812, and a data encoding portion 814. Control code portion 810 includes one code word corresponding to and for encoding a control character. Resynchronization portion 812 contains two 28-bit code words corresponding to and for encoding resynchronization characters. Data encoding portion 814 includes code words 0 through FF (hexadecimal), corresponding to and for encoding 256 data characters. Thus, code set B contains a total of 257 14-bit code words (in control code portion 810 and data encoding portion 814) and two 28-bit code words (in resynchronization portion 812). Like code set A, code set B contains 14-bit code words that are balanced and that have a distance of at least four. The 28-bit code words are also balanced (over each 28-bit sequence) and are chosen so that a received sequence of several resynchronization data blocks will not duplicate any received sequence of framed or unframed 14-bit valid data blocks.

Figure 9:
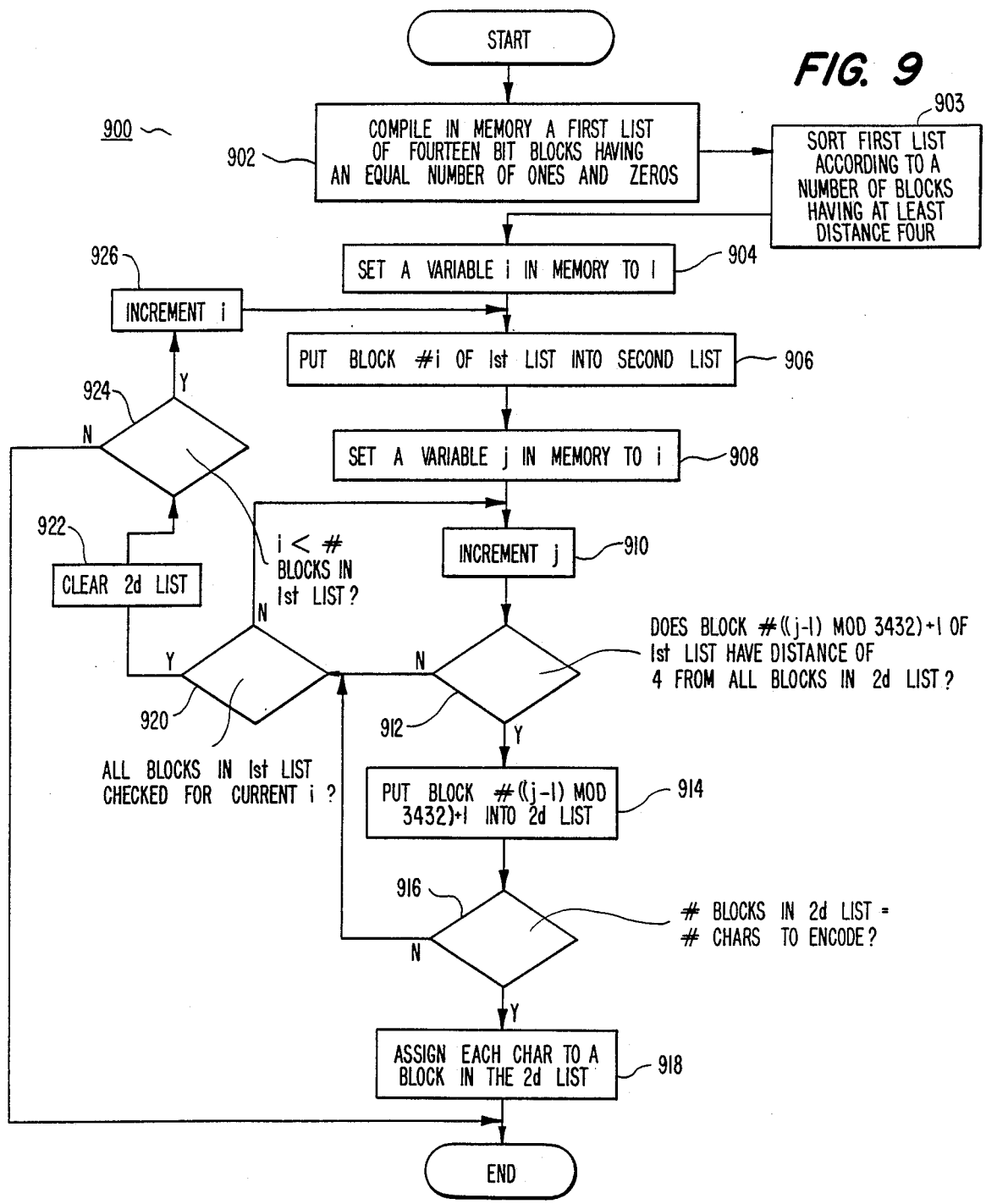
FIG. 9 is a flow chart of a method performed by a data processing system to generate the code sets of FIGS. 7 and 8.

FIG. 9 shows a flow chart 900 describing a method performed by a data processing system for identifying the code words of, among others, portions 710 and 714 and portions 810 and 814 of code set A and code set B. In step 902, the data processing system compiles in its memory, a list of all possible 14-bit data blocks having an equal number of ones and zeros. The blocks in this list are preferably stored as elements in an array, but could also be stored as elements of a linked list or in similar well-known data structures.

Theory shows that for m bit data blocks, there are $$M(m) = \binom{m}{\frac{m}{2}}; \text{ where } \binom{x}{y} = \frac{x!}{y!(x-y)!}$$

such balanced blocks. Thus, for m=14, a total of 3432 balanced blocks exist. In step 903, for each block in the first list, the number of other blocks having a distance of at least 4 from that block is calculated. The first list is then sorted in descending order according to this calculated number. Note that if step 903 is omitted, the remaining steps of the described method still identify a satisfactory code set, although this code set may differ from the code set identified by the method including step 903.

In step 904, a variable i, located in the memory of the data processing system, is initialized to one. Next, in step 906, block number i of the list compiled in step 902 is positioned as the first block in a second, empty list also stored in the memory of the data processing system. In step 908, a variable j in the memory of the data processing system is set equal to the variable i. Step 910 increments this variable j. Next, a block in the first list is tested to determine whether it has a distance of at least four from all blocks thus far in the second list. If yes, the tested block is placed into the second list in step 914 and a test is performed in step 916 to determine whether the second list now contains a desired number of blocks. If the second list contains a desired number of blocks having an equal number of binary ones and zeroes and a distance of at least four, control passes to step 918. The blocks of the second list correspond to a code set, such as code set A, and each character to be encoded is arbitrarily assigned to correspond to a block in the second list. Thus, the method of FIG. 9 identifies a non-systematic code set.

Note that, in a preferred embodiment, some of the control characters may not be arbitrarily assigned, but may be assigned to a block in the second list that has certain desirable properties. For example, the I symbol of code set A is not arbitrarily assigned. Its code word (1595 hexadecimal) was chosen because it has a pattern of ones and zeroes with a large number of transitions. In a preferred embodiment, the I symbol (an Idle symbol) is transmitted often and, thus, its code word was chosen because it provides an extremely reliable clock component.

If the result of the test in step 912 or in step 916 is negative, control passes to step 920 to determine if untested blocks remain in the first list. If untested blocks remain, control passes to step 910 and the above-described process is repeated for another block in the first list. If all blocks in the first list have been tested (step 920) then all blocks are removed from the second list in step 922 and a test is performed in step 924 to determine whether any blocks in the first list have not been first blocks in the second list. If yes, i is incremented in step 926 and control passes to step 906. If no, each block in the first list has been the first block of the second list and processing is halted.

The method of FIG. 9 was used to determine both code set A of FIG. 7 and code set B of FIG. 8. A Digital Equipment Corporation VAX 8650 computer performed the steps of this method for approximately two weeks of CPU time to determine code sets A and B.

A receiving station 300 is shown in FIG. 3 as having a channel 222, a detector, amplifier, and automatic gain control (AGC) element (Detector/Amplifier) 302, a connecting line 322, a connecting line 324, a clock recovery element 304, a connecting line 326, a decision element 306, a clock line 328, a serial data line 330, a synchronization detector 308, a reset line 332, a serial to parallel converter (SIPO) 310, a 14-bit data bus 334, a clock line 336, a decoder 312, a 9-bit decoded data and control bus 338, an uncorrectable_error line 340, a corrected_error line 342, and a data link element 314.

Detector/amplifier element 302 outputs a detected and amplified signal to clock recovery element 304 on connecting line 324 and to decision element 306 on connecting line 322. Clock recovery element 304 outputs a recovered clock signal to decision element 306 on connecting line 326. Decision element 306 outputs a clock signal on clock line 328 and a serial data signal on serial data line 330. Both of the lines 328 and 330 are input to synchronization detector 308 and to SIPO 310. Synchronization detector 308 outputs a reset signal on reset line 332 to SIPO 310. SIPO 310 outputs a 14-bit data signal on 14-bit data bus 334 to decoder 312. SIPO 310 also outputs a clock signal on clock line 336 to decoder 312. Decoder 312 outputs 9-bit decoded data and control information on 9-bit decoded data and control bus 338, an uncorrectable_error signal on uncorrectable_error line 340, a corrected_error signal on corrected_error line 342, and a clock signal on clock line 336 to data link element 314.

The transmitted code word is received on channel 222 as a signal containing a data block. The signal containing the data block is amplified and fed through an automatic gain control circuit. This signal is provided to both clock recovery circuit 304 and decision circuit 306. Decision circuit 306 samples the signal at times specified by clock recovery circuit 304 and decides whether the signal represents a binary one or zero. The outputs of clock recovery circuit 304 and decision circuit 306 are then fed to SIPO 310 and to synchronization detector 308. Reset line 322, which is asserted whenever a resynchronization data block is received, is input to SIPO 310. In a preferred embodiment, resynchronization characters are encoded and transmitted when the data processing system is initialized. Other embodiments may encode and transmit resynchronization characters at predetermined intervals. SIPO 310 converts the serial data to parallel and passes this data and a clock signal clock PAR representing the recovered clock rate divided by fourteen to decoder 312. Decoded data characters and control information are then output to data link element 314 for further processing.

In accordance with the invention, the invention comprises a decoding means in the receiving station for converting each of the received data blocks to the ones of said characters corresponding to the code words represented by said received data blocks.

Decoder 312 of FIG. 4, shown by way of example and not as a limitation, comprises 14-bit data bus 334, clock line 336, a latch 402, a 14-bit data bus 408, decoder elements $404_0$–$404_{259}$, match lines $410_0$–$410_{259}$, corrected_L lines $412_0$–$412_{259}$, a NOR gate 414, a NAND gate 418, a latch 416, an uncorrectable_error line 340, encoder elements $406_0$–$406_{259}$, a 9-bit data bus 422, a latch 420, and a corrected_error line 342.

Fourteen-bit data bus 334 and clock line 336 are input to latch 402. Clock line 336 is also input to each of the encoder elements $406_0$–$406_{259}$ and to latch 416 and latch 420. Fourteen-bit data is output on 14-bit data bus 408 from latch 402 into each of the decoder elements $404_0$–$404_{259}$. Each decoder element 404 asserts a match line 410 to a corresponding encoder element 406 and to NOR gate 414. Each decoder element 404 also asserts a corrected_L line 412 to NAND gate 418. The output of NOR gate 414 is input to latch 416 where it is latched to uncorrectable_error line 340. The output of NAND gate 418 is input to latch 420 where it is latched to a corrected_error signal on corrected_error line 342. The output of each encoder element 406 is connected to 9-bit data bus 422.

The decoder of a preferred embodiment decodes data blocks corresponding to code set A of FIG. 7. The decoder of another preferred embodiment decodes data blocks corresponding to code set B of FIG. 8. In a preferred embodiment, the actual decoding and error correction is performed in parallel by decoder elements $404_0$–$404_{259}$. Each decoder element 404 is devoted to comparing a received 14-bit data block with a different one of the two hundred sixty code words of code set A of FIG. 7. These two hundred sixty code words are called the target data. Each decoder element 404 determines whether the 14-bit input exactly matches the 14 bits of target data to which that decoder element is devoted. Each decoder element 404 also determines whether the 14-bit input differs from its target data by exactly one bit (a single bit error). If there is an exact match or a single bit error, then the decoder element asserts its match line 410. Only one match line 410 will be asserted when a correct or correctable data block is received because the distance of code set A is four. If there is a single bit error, the decoder element 404 also asserts a second match line (corrected_L line) 412.

Each decoder element 404 of decoder 312 in the receiving station has an associated encoder element 406 in the decoder 312. Each encoder element 406 drives 9-bit data bus 422 with an appropriate 8-bit character plus a control bit. Each of the match lines 410 is fed to one of two hundred sixty inputs of NOR gate 414, where they are NOR'd together and latched by latch 416 to produce a signal on uncorrectable_error line 340. Note that, in a preferred embodiment, NOR gate 414 is embodied in several layers of logic gates having the function of a 260 input NOR gate. Each of the corrected_L lines 412 is fed to one of two hundred sixty inputs of NAND gate 418 whose output is latched by latch 420 to produce a signal on corrected_error line 342. Note that, in a preferred embodiment, NAND gate 418 is embodied in several layers of logic gates having the function of a 260 input NAND gate.

Figure 5A:
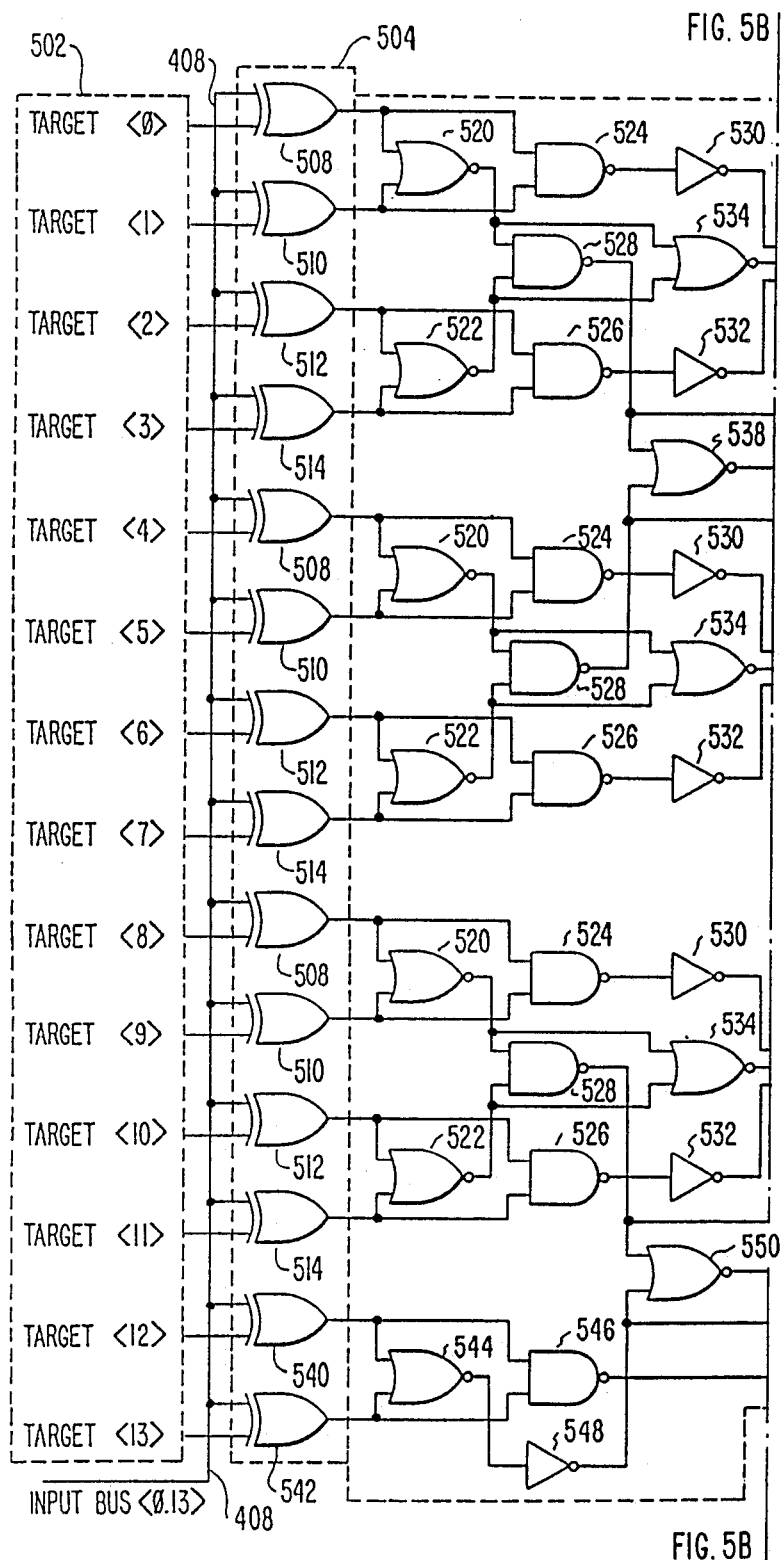
FIG. 5 is a circuit diagram of one decoder element of the decoder of FIG. 4.
Figure 5B:
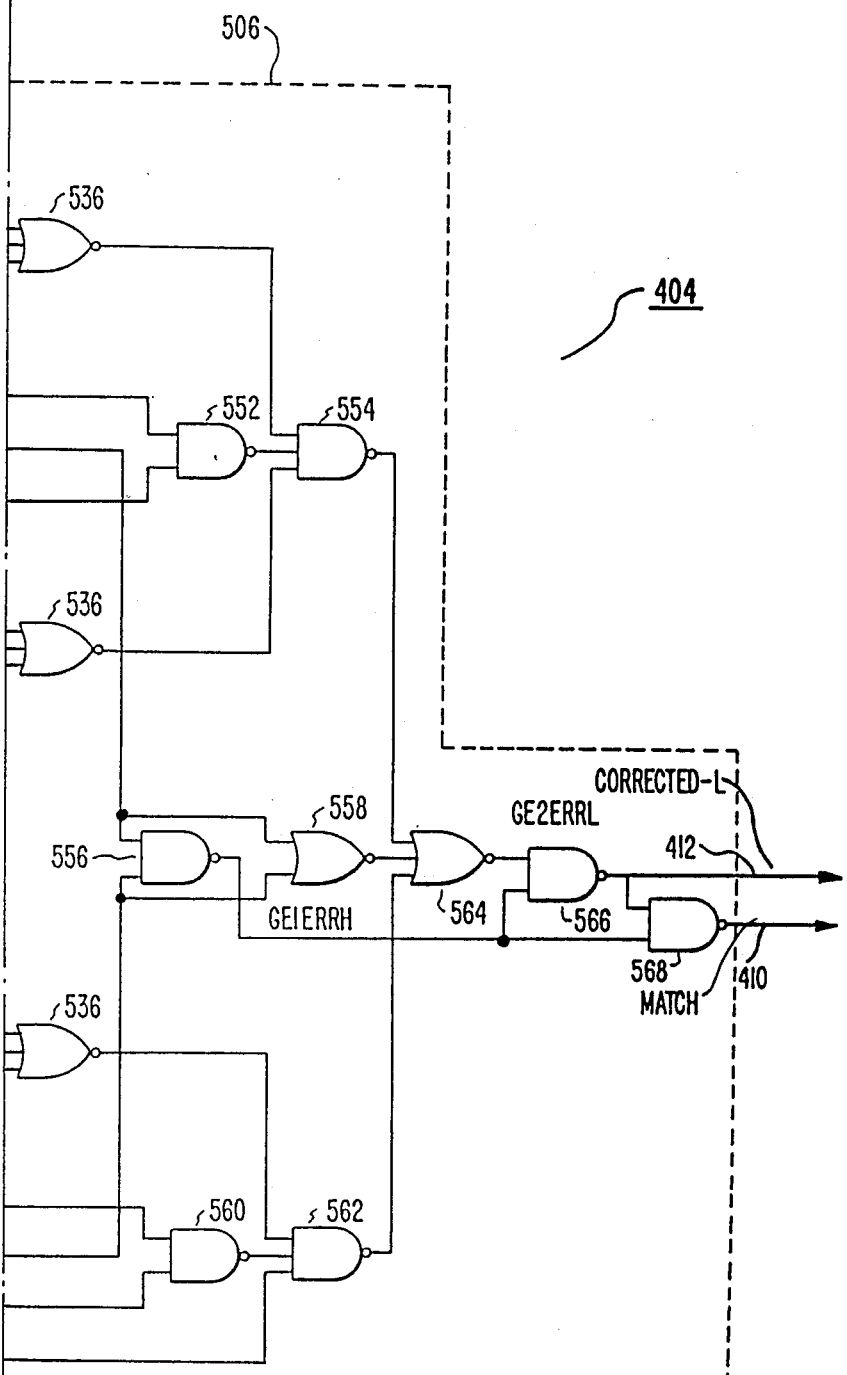

FIG. 5 shows a circuit diagram of one of the two hundred sixty decoder elements 404 of FIG. 4. Each decoder element 404 includes a memory portion 502, an exclusive OR (XOR) portion 504, a detecting logic portion 506, 14-bit data bus 408, corrected_L line 412, and match line 410.

Memory portion 502 includes target data[0]-[13]. Each bit of target data[0]—[13] is input to a corresponding XOR gate in XOR portion 504. XOR portion 504 includes three XOR gates 508, three XOR gates 510, three XOR gates 512, three XOR gates 514, an XOR gate 540, and an XOR gate 542. Detecting logic portion 506 includes three NOR gates 520, three NOR gates 522, three NAND gates 524, three NAND gates 526, three NAND gates 528, three inverters 530, three inverters 532, three NOR gates 534, three NOR gates 536, a NOR gate 538, a NOR gate 544, a NAND gate 546, an inverter 548, a NOR gate 550, a NAND gate 552, a NAND gate 554, a NAND gate 556, a NOR gate 558, a NAND gate 560, a NAND gate 562, a NOR gate 564, a NAND gate 566, and a NAND gate 568.

The description in the following paragraph of the connections of target data [0]-[3] also applies to the connections of target data [4]-[7] and target data [8]-[11]. XOR gates 508, 510, 512, and 514 have as inputs respective bits of 14-bit data bus 408 and respective bits of memory portion 502. The output of XOR gate 508 is input to NAND gate 524 and NOR gate 520. The output of XOR gate 510 is output to NAND gate 524 and NOR gate 520. The output of XOR gate 512 is input to NAND gate 526 and NOR gate 522. The output of XOR gate 514 is output to NAND gate 526 and NOR gate 522. The output of NAND gate 524 is input to inverter 530. The output of NOR gate 520 is input to NOR gate 534 and NAND gate 528. The output of NOR gate 522 is input to NOR gate 534 and NAND gate 528. The output of NAND gate 526 is input to inverter 532. The output of NOR gate 534 is input to NOR gate 536. The output of inverters 530 and 532 are input to respective NOR gates 536.

The description in the following paragraph applies to gates associated with target data [0]-[3] and target data [4]-[7]. The outputs of NAND gates 528 of FIG. 5 are both input to NOR gate 538 and NAND gate 552. The outputs of NOR gates 536 are input to NAND gate 554. The output of NOR gate 538 is input to NAND gate 556 and NOR gate 558. The output of NAND gate 552 is input to NAND gate 554. The output of NAND gate 554 is input to NOR gate 564.

The output of the lower NAND gate 528 of FIG. 5 (associated with target data [8]-[11]) is input to NOR gate 550. The outputs of target data [12]-[13] are input to XOR gates 540 and 542, respectively. The outputs of XOR gates 540 and 542 are both input to NAND gate 546 and NOR gate 544. The output of NOR gate 544 is input to inverter 548. The output of inverter 548 is input to NOR gate 550 and NAND gate 560. The output of NAND gate 546 is input to NAND gate 562. The output of NOR gate 550 is input to NAND gate 556 and NOR gate 558. The output of NAND gate 560 is input to NAND gate 562. The output of NAND gate 562 is input to NOR gate 564.

The output of NAND gate 556 is input to NAND gates 566 and 568. The output of NOR gate 558 is input to NOR gate 564. The outputs of NAND gates 554 and 562 are also input to NOR gate 564. The output of NOR gate 564 is input to NAND gate 566. The output of NAND gate 566 is corrected_L line 412, which is also input to NAND gate 568. The output of NAND gate 568 is match line 410.

When the 14 bits on 14-bit data bus 408 match the 14 bits of target data [0]-[13] or when the 14 bits on data bus 408 differ from the target data [0]-[13] by exactly one bit, match line 410 is asserted. When the 14 bits on 14-bit data bus 408 differ from [0]-[13] by exactly one bit, corrected_L line 412 is also asserted.

Figure 6:
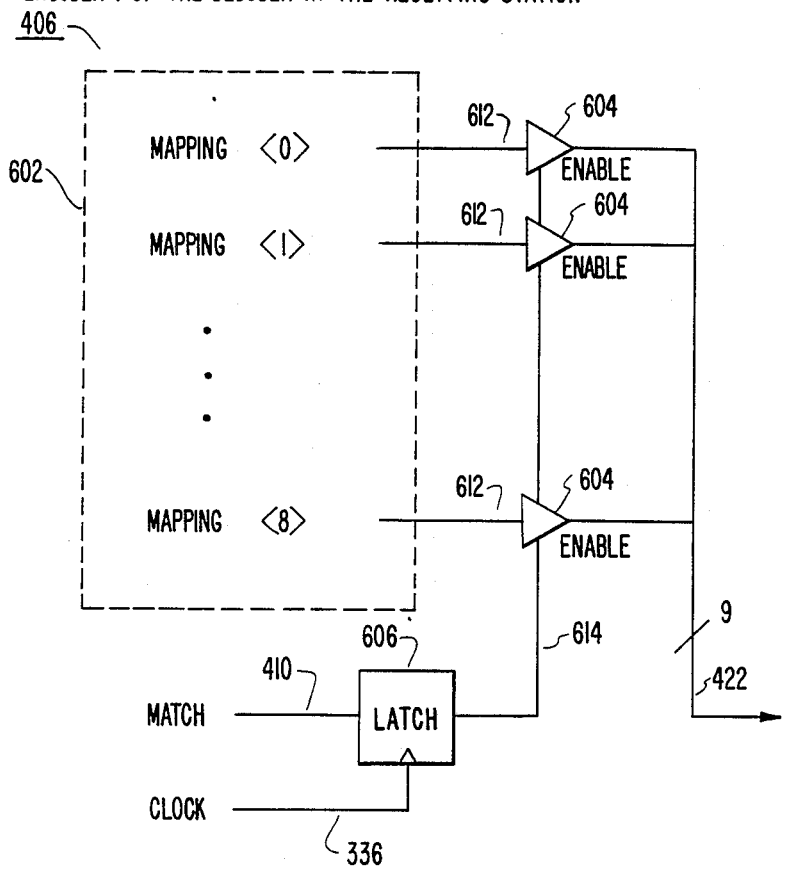
FIG. 6 is a block diagram of one encoder element of the decoder of FIG. 4.

FIG. 6 is a block diagram of one encoder element of the two hundred sixty encoder elements $406_0$-$406_{259}$ of FIG. 4. Each encoder element 406 includes a memory 602, connecting lines 612, enable gates 604, a 9-bit data bus 422, match line 410, clock line 336, latch 606, and connect line 614.

In a preferred embodiment, memory 602 includes 9 data bits labeled mapping[0]-[8], representing 9 bits of character data in the code set A (8 bits of data plus a control character indicator). In another preferred embodiment, mapping[0]-[8] represents 9 bits of character data in code set B. Each bit in memory 602 is connected by a connecting line 612 to a respective enable gate 604. Match line 410 and clock line 336 are input to latch 606, which outputs an enable signal on connecting line 614 to each enable gate 604, thus enabling the output of one bit of data from each enable gate 604 onto 9-bit data bus 422 when the 14-bits of received data match (or differ by one bit) from target data [0]-[13] of FIG. 5. As described above, the 9-bit character data on 9-bit data bus 422 is then passed to data link element 314 for further processing. If, for example, in the rare instance that uncorrectable_error line 340 is activated, data link element 314 may request a resend from the transmitting station.

The preferred embodiments described above use the balanced weight property of code sets A and B for allowing AC coupling and for extracting a clock signal. Other preferred embodiments of the invention may contain elements for performing additional error detection operations based on the balanced weight properties of these code sets without departing from the spirit and scope of the invention.

Other embodiments of the invention will be apparent to those skilled in the art from consideration of the specification and from practice of the invention disclosed herein. It is intended that a specification and examples be considered as exemplary only, with a true scope and spirit of the invention being indicated by the following claims.

What is claimed is:

1. A distributed processing system for transmitting data blocks from a transmitting station to a receiving station, each data block representing one of a plurality of code words encoding one of a plurality of characters, the distributed processing system comprising:
    encoding means in the transmitting station for converting each of the plurality of characters to a predetermined corresponding one of a plurality of balanced weight fixed distance code words;
    transmitting means for transmitting said code words as data blocks;
    receiving means for receiving said transmitted data blocks; and
    decoding means in the receiving station for converting each of the received data blocks to the ones of said characters corresponding to the code words represented by said received data blocks.

2. The distributed processing system of claim 1 wherein said balanced weight fixed-distance code words contain an equal number of ones and zeroes and have a distance from each other of at least four.

3. The distributed processing system of claim 1, wherein the transmitting station includes a memory containing said balanced weight fixed-distance code words and wherein said encoding means further includes:

encode circuitry for converting each of said characters to a corresponding one of said code words according to said predetermined correspondence.

4. The distributed processing system of claim 1, wherein said receiving station has a memory containing a plurality of target code words corresponding to said balanced weight fixed-distance code words, wherein said predetermined correspondence also exists between the plurality of characters and the target code words, wherein the received data blocks and the target code words consist of data bits, and wherein said decoding means further includes:

detecting means for outputting one of a plurality of first match signals identifying a target code word identical to a received data block, for outputting one of said first plurality of first match signals identifying a target code word differing from a received data block by exactly one bit, and for outputting one of a plurality of second match signals when a target code word differs from a received data block by exactly one bit; and converting means coupled to said detecting means for outputting one of the plurality of characters according to said predetermined correspondence between said character and said target code word identified by said first match signal.

5. The distributed processing system of claim 4, wherein said detecting means of said receiving station includes a plurality of elements, each element including:

an exclusive-OR portion for comparing respective bits of one target code word in the memory and one of the received data blocks; and a detecting logic portion coupled to said exclusive-OR portion for outputting said first and second match signals responsive to an output of said exclusive-OR portion.

6. The distributed processing system of claim 4, wherein said detecting means of said receiving station includes means for outputting an uncorrectable error signal when none of said target code words is identical to a received data block and none of said target code words differs from a received data block by exactly one bit.

7. The distributed processing system of claim 4, wherein said converting means of said receiving station includes a plurality of elements, each element including:

a memory for storing one of said plurality of characters; and means for outputting said one stored character when a first match signal identifying a corresponding one of said target code words is output by said detecting means.

8. The distributed processing system of claim 1, wherein said encoding means includes means for converting each of the plurality of characters to a fourteen bit code word and wherein said decoding means includes means for converting a fourteen-bit received data block to a corresponding one of the plurality of characters.

9. The distributed processing system of claim 1, wherein said encoding means includes means for converting each of 260 characters to a predetermined one of said code words and wherein said decoding means includes means for converting each of said received data blocks into a predetermined one of said 260 characters.

10. The distributed processing system of claim 1, wherein said encoding means includes means for converting each of 257 characters to a predetermined one of said code words and wherein said decoding means includes means for converting each of said received data blocks into a predetermined one of said 257 characters.

11. The distributed processing system of claim 1, wherein said encoding means includes means for converting control code characters and data characters to code words and wherein said decoding means includes means for converting received data blocks to control code characters and data characters.

12. The distributed processing system of claim 1, wherein said encoding means includes means for transmitting a resynchronization data block preceding a first one of said data blocks and wherein said decoding means includes means for converting a received data block preceded by said resynchronization data block.

13. The distributed processing system of claim 1 further including:

a clock recovery element in the receiving station for recovering a clock signal from said received data blocks.

14. A receiving station in a distributed processing system, wherein data blocks representing code words encoding ones of a plurality of characters are received by the receiving station, the receiving station comprising:

receiving means for receiving said data blocks; and decoding means for converting each of the received data blocks to a predetermined one of said characters according to a balanced weight fixed-distance code having a predetermined correspondence between the characters and the code words.

15. The receiving station of claim 14, wherein said code words of said balanced weight fixed-distance code contain an equal number of binary ones and zeroes and have a distance of at least four.

16. The receiving station of claim 14 having a memory containing a plurality of target code words corresponding to code words of the balanced weight fixed-distance code, wherein said predetermined correspondence also exists between the plurality of characters and the target code words, wherein the received data blocks and the target code words consist of data bits, and wherein said decoding means further includes:

detecting means for outputting one of a plurality of first match signals identifying a target code word identical to a received data block, for outputting one of said plurality of first match signals identifying a target code word differing from a received data block by exactly one bit, and for outputting one of a plurality of second match signals when a target code word differs from a received data block by exactly one bit; and converting means coupled to said detecting means for outputting one of the plurality of characters according to said predetermined correspondence between said character and said target code word identified by said first match signal.

17. The receiving station of claim 16, wherein said detecting means includes a plurality of elements, each element including:

an exclusive-OR portion for comparing respective bits of one target code word in the memory and one of the received data blocks; and a detecting logic portion coupled to said exclusive-OR portion for outputting said first and second match signals responsive to the output of said exclusive-OR portion.

18. The receiving station of claim 16, wherein said detecting means includes means for outputting an uncorrectable error signal when none of said target code words is identical to a received data block and none of said target code words differs from a received data block by exactly one bit.

19. The receiving station of claim 16, wherein said converting means further includes a plurality of elements, each element including:
   a memory for storing one of said plurality of characters; and
   means for outputting said one stored character when a first match signal identifying a corresponding one of said target code words is output by said detecting means.

20. The receiving station of claim 14, wherein said decoding means includes means for converting fourteen-bit data blocks to corresponding ones of the plurality of characters.

21. The receiving station of claim 14, wherein said decoding means includes means for converting said received data blocks to corresponding ones of 260 characters.

22. The receiving station of claim 14, wherein said decoding means includes means for converting said received data blocks to corresponding ones of 257 characters.

23. The receiving station of claim 14, wherein said decoding means includes means for converting said received data blocks to corresponding ones of control code characters and data characters.

24. The receiving station of claim 14, wherein a first data block is preceded by a resynchronization data block, and wherein said decoding means includes means for converting a received data block preceded by said resynchronization data block to one of the plurality of characters.

25. The receiving station of claim 14, further including:
   a clock recovery element for recovering a clock signal from said received data blocks.

26. A transmitting station in a distributed processing system transmitting data blocks representing code words encoding a plurality of characters, comprising:
   encoding means for converting each of the plurality of characters to a predetermined corresponding one of a plurality of balanced weight fixed-distance code words; and
   transmitting means for transmitting said code words as data blocks.

27. The transmitting station of claim 26, wherein said code words of said balanced weight fixed-distance code contain an equal number of ones and zeroes and have a distance of at least four.

28. The transmitting station of claim 26 having a memory containing said balanced weight fixed-distance code words and wherein said encoding means further includes:
   encode circuitry for converting each of said characters to a corresponding one of said code words according to said predetermined correspondence.

29. The transmitting station of claim 26, wherein said encoding means includes means for converting each of the plurality of characters to a corresponding fourteen-bit code word.

30. The transmitting station of claim 26, wherein said encoding means includes means for converting each of 257 characters to a corresponding code word.

31. The transmitting station of claim 26, wherein said encoding means includes means for converting each of 260 characters to a corresponding code word.

32. The transmitting station of claim 26, wherein said encoding means includes means for converting control code characters and data characters to corresponding code words.

33. The transmitting station of claim 26, wherein said encoding means includes means for transmitting a resynchronization data block preceding a first one of said data blocks.

34. A method for transferring a plurality of characters between a transmitting station and a receiving station, the method comprising the steps of:
   encoding, by the transmitting station, each data character in a predetermined corresponding code word of a balanced weight fixed-distance code;
   transmitting, by the transmitting station, data blocks representing said code words to the receiving station;
   receiving, by the receiving station, said transmitted data blocks;
   decoding, by the receiving station, ones of said received data blocks according to the balanced weight fixed-distance code, yielding a plurality of said characters;
   recognizing, by the receiving station, received data blocks that differ by one bit from corresponding code words in the balanced weight fixed-distance code as incorrectly received; and
   decoding, by the receiving station, said recognized data blocks according to said corresponding code words in the balanced weight fixed-distance code, yielding said characters.

35. The method of claim 34, wherein said encoding step further comprises the step of encoding each character in a code word having a distance of at least four.

36. The method of claim 34, wherein said encoding step further includes the step of encoding each data character in a fourteen-bit code word, and wherein said decoding step further includes the step of decoding ones of said fourteen-bit data blocks.

37. A method for encoding characters sent by a transmitting station to a receiving station, said method comprising the steps, performed by the transmitting station, of:
   converting each character to a predetermined corresponding fourteen-bit code word of a balanced weight fixed-distance code, wherein each of said code words has a distance of at least four; and
   transmitting fourteen-bit data blocks representing said code words to the receiving station.

38. A method for decoding data blocks received by a receiving station, said method comprising the steps, performed by said receiving station, of:
   receiving fourteen-bit data blocks encoding code words of a balanced weight fixed-distance code having a distance of at least four;
   decoding ones of said received fourteen-bit data blocks according to a matching code word in said balanced weight fixed-distance code, yielding a plurality of said data characters;

recognizing received fourteen-bit data blocks that differ by one bit from corresponding code words in said balanced weight fixed-distance code as incorrectly received; and decoding said recognized fourteen-bit data blocks according to said corresponding code words.

39. A method, performed by a data processing system having a memory, for identifying a plurality of balanced weight fixed-distance code words encoding a plurality of characters, said method comprising the steps of:

listing in the memory of said data processor a plurality of fixed length blocks of data bits having an equal number of binary ones and zeroes;

identifying, in the memory of said data processing system, those of said blocks having a distance of four from each other;

halting said step of identifying when the number of identified blocks equals the number of said characters; and assigning each of said characters to a different one of said identified blocks.

40. The method of claim 39, wherein each of said block has fourteen data bits and wherein said step of listing includes a step of listing each of said fourteen-bit blocks having seven binary ones.

41. The method of claim 39, wherein said step of listing includes the step of sorting said blocks according to those of said blocks having a distance of at least four from each of said blocks.

42. The method of claim 39, wherein said step of identifying includes the steps of:

selecting one of said blocks;

selecting those of said blocks having a distance of four from said selected one of said blocks and each other;

when the number of selected blocks having a distance of four is less than a predetermined number, selecting a different one of said blocks; and repeating said step of selecting those of said blocks having a distance of four from said selected different one of said blocks and each other.

* * * * *